United States Patent [19]

Berndes et al.

[11] 4,121,239
[45] Oct. 17, 1978

[54] CONTROLLABLE SEMICONDUCTOR COMPONENT FOR TWO CURRENT DIRECTIONS

[75] Inventors: Günter Berndes, Heppenheim; Eckhard Meyer, Lampertheim, both of Germany

[73] Assignee: BBC Brown, Boveri & Company Limited, Baden, Switzerland

[21] Appl. No.: 814,919

[22] Filed: Jul. 12, 1977

[30] Foreign Application Priority Data

Aug. 12, 1976 [DE] Fed. Rep. of Germany ....... 2636234

[51] Int. Cl.² .......................................... H01L 29/747
[52] U.S. Cl. ....................................... 357/39; 357/55; 357/86
[58] Field of Search .................... 357/39, 86, 55, 38

[56] References Cited

U.S. PATENT DOCUMENTS

| 3,696,273 | 10/1972 | Foster | 357/39 |
|---|---|---|---|
| 3,996,601 | 12/1976 | Hutson | 357/39 |
| 4,021,837 | 5/1977 | Hutson | 357/39 |

*Primary Examiner*—Joseph E. Clawson, Jr.
*Attorney, Agent, or Firm*—Oblon, Fisher, Spivak, McClelland & Maier

[57] ABSTRACT

A controllable semiconductor component for two current directions comprising a semiconductor wafer having a middle zone of a first conductivity type extending throughout the wafer plane, an upper zone of a second conductivity type adjoining the middle zone from above, a lower zone of the second conductivity type adjoining the middle zone from below, a first main electrode zone of the first conductivity type adjoining a first partial zone on the upper side of the upper zone, a second main electrode zone of the first conductivity type adjoining a first partial zone on the underside of the lower zone, a first control-electrode zone of the second conductivity type on the upper side of the upper zone and at a lateral distance from the first main electrode zone, a second control-electrode zone of the first conductivity type on the upper side of the upper zone and at a distance from the first main-electrode zone and a notch between the control-electrode zones which extends laterally partway between the first partial zone with the first main-electrode zone, on the one hand, and the second partial zone of the upper zone, on the other hand, and in its depth going from the upper towards the lower side of the semiconductor wafer partway into the middle zone, a first main electrode contacting the first main electrode zone and a second partial zone of the upper zone, a second main electrode contacting the second main-electrode zone and a second partial zone of the lower zone, a control-electrode arrangement for separate contacting of the two control-electrode zones, and a case enclosing the wafer, wherein the two control-electrode leads are brought out electrically separated through the case from their separate control electrodes on the semiconductor wafer.

5 Claims, 8 Drawing Figures

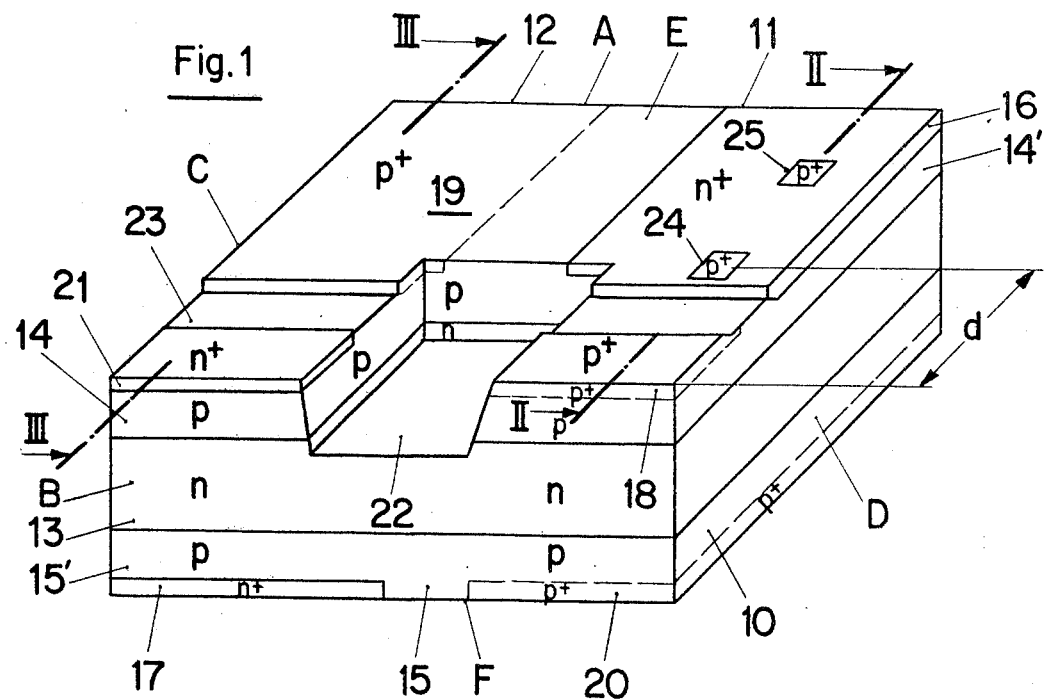
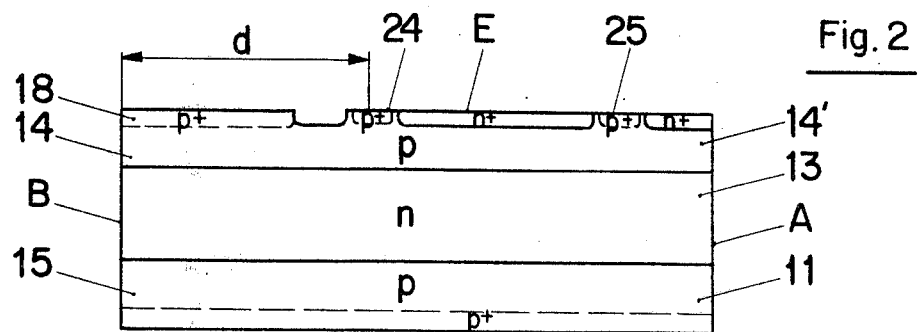
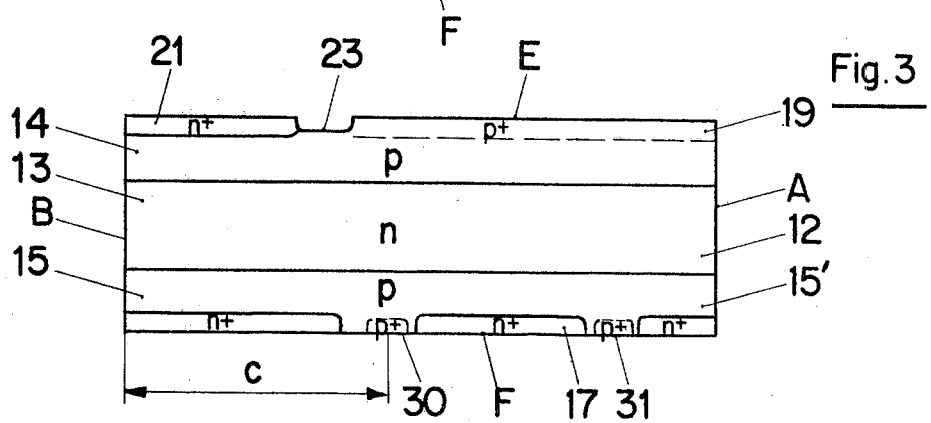

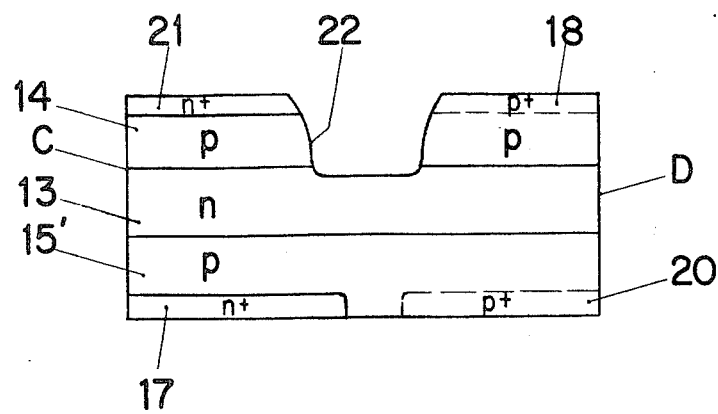
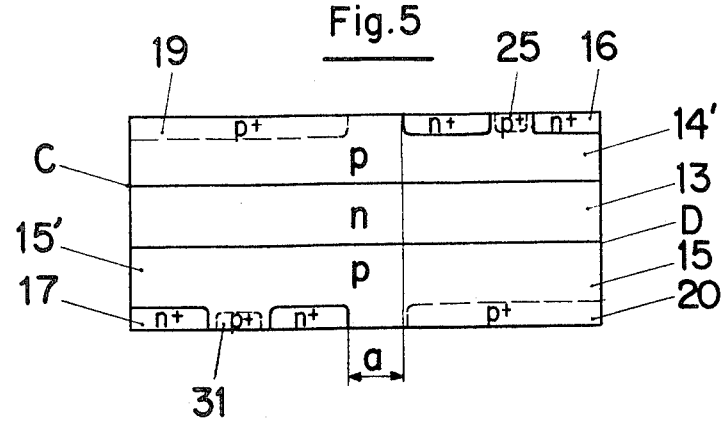
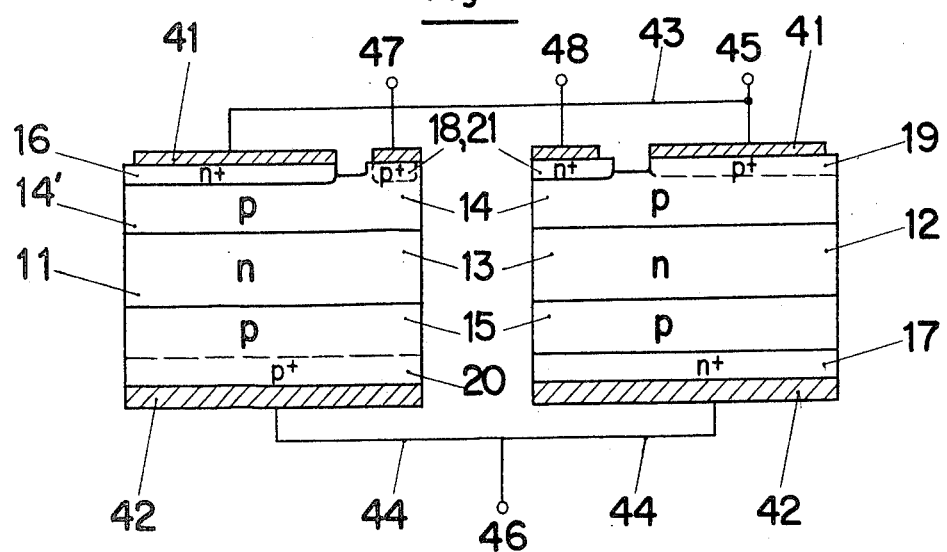

CONTROLLABLE SEMICONDUCTOR COMPONENT FOR TWO CURRENT DIRECTIONS

BACKGROUND OF THE INVENTION

1. Field of the Invention

The invention relates to a controllable semiconductor component for two current directions having application as control element in electric power supply installations or control circuits, especially as a.c. regulating units.

2. Description of the Prior Art

Such a semiconductor component switching bidirectionally between higher and lower impedance for both current directions with reversible orientation in view of the designations "over" and "under" is known from U.S. Pat. No. 3,275,909. It comprises in a semiconductor wafer a middle zone of a first conductivity type extending through the entire cross-section of the wafer. Adjoining this middle zone above and below are an upper and a lower zone of a second conductivity type opposite to the first. Adjoining a first partial zone on the upper side of the upperzone and a first partial zone on the underside of this lower zone, respectively, are a first and a second main-electrode zone of the first conductivity type. On the upper side of the upper zone of the second conductivity type and separated laterally from the first main-electrode zone is a first control-electrode zone of the second conductivity type. A second control electrode zone of the first conductivity type (called the remote gate) is situated on the upper side of the upper zone at a distance from the first main electrode zone. A first main electrode is in contact with the first main-electrode zone and with a second partial zone of the upper zone. A second main electrode is in contact with the second main electrode zone and with a second partial zone of the lower zone. A control-electrode arrangement for separate contacting of the two control-electrode zones is provided. A case encloses the wafer, where the two control-electrode leads are brought out electrically isolated through the case from their separate control electrodes on the semiconductor chip.

The known semiconductor component thus possesses on one side two control electrodes with ohmic contacts and a main electrode, and on the other side a main electrode. In one design the control-electrode leads are electrically connected to one another, so that a common control-electrode lead is brought out of the case. The known component in this form does not differ externally from a conventional thyristor-triode (Triac) (of e.g. "SCR Manual", 4th edition (1967) General Electric, p. 13; Heumann/Stumps, "Thyristoren" 3rd edition (1947), p. 36) and comprises two thyristors, a normal thyristor for quadrant I of the current-voltage characteristic and an inverted thyristor connected antiparallel to this (quadrant III) in a single semiconductor chip. The inverted thyristor is normally triggered by the "remote gate" somewhat later than the normal thyristor; it is more difficult to fire. In phase-shift control this leads to asymmetry and can thus cause disturbing reactions, e.g. in low-voltage distribution systems.

In another design described in U.S. Pat. No. 3,275,909 the two control-electrode connections and leads are electrically isolated to give a component with four external leads.

The control is already improved with the arrangement, differing from the conventional Triac, of two control electrodes on the semiconductor chip. The first control electrode is contacted on the zone of the second (p-) conductivity type next to the middle zone, in the neighborhood of the first main electrode zone of the first (n-) conductivity type. Laterally, however, it is widely separated from the part of the p-zone which is contacted by the first (there underneath) main electrode, and from the second control electrode (remote gate) which is contacted by a second n-conducting control-electrode zone. In this way the two control electrodes are thoroughly electrically isolated from one another by the long path with high specific resistance in the p-zone, and there also is avoided an electrical short circuit between the control-electrode terminal and the main-electrode terminal. The arrangement of the second control electrode and the second control-electrode zone leads in a known manner to an additional pn-junction for the purpose of indirect-control with negative control current with forward loading of the inverse thyristor or "remote gate thyristor".

The mutual arrangement of two thyristors in a semiconductor chip in the above described form leads, however, to undesirable interaction between the two thyristor systems. When the semiconductor component is rapidly switched between quadrant I and quadrant II minority charge carriers are diffused into the inverse thyristor in the region of the latter's blocking pn-junction even during conduction of the normal thyristor. Upon application of the forward voltage for the inverse transistor, this can lead to turn-on without a corresponding control signal, so that triggering by an undesirably low voltage occurs (DT-AS No. 1,564,420; DT-AS No. 1,931,149; DT-AS No. 2,033,566).

The following measures for solving this problem are known: a) separation of the main-electrode zones (emitter zones) in their projections on a reference plane parallel to the wafer plane (DT-OS No. 1,564,420); b) separation of the emitter zones on the order of at least three diffusion lengths of the minority charge carriers and a larger specific resistance in the region of the semiconductor chip between the two thyristor systems (DT-AS No. 1,931,149); c) binding of the minority charge carriers by recombination centers in the region of the semiconductor chip between the two thyristors systems (DT-AS No. 2,033,566).

In all the above-mentioned known cases Triacs are involved, i.e. bidirectional controllable semiconductor components with three external current leads or external electrode terminals.

SUMMARY OF THE INVENTION

Accordingly, one object of this invention is to provide a controllable semiconductor component having four external electrode leads which exhibits a switching behavior symmetric in the two current directions.

A further object of the present invention is to provide such a component which exhibits a symmetric triggering behavior and a symmetric voltage breakdown strength with respect to the voltage rise rate (du/dt - strength or critical voltage rise rate) even with a partly inductive load.

Until now the electrical connection of the control-electrode leads without finer differentiation with respect to the application has been considered equivalent to a configuration with a total of four separate electrode leads and the choice made dependent only on the particular desired polarity at the control electrodes with respect to that at the main electrodes (U.S. Pat. No. 3,275,909). Electrical connection of the control electrodes is also described in DT-AS No. 1,931,149. However, if the control electrodes are connected, then a mutual interaction between the control zones through charge-carriers drift is not excluded. The phase shift between voltage and current arising with an inductive load can, e.g. after conduction in quadrant I, lead to modulation of the normal thyristor, because at the end of the positive half-wave of current the beginning negative half-wave of voltage is already started. It follows in general, then, that the main injection zones, as described above, should be kept from overlapping and the control-electrode zones and leads should be electrically separated.

The objects of the present invention are thus achieved by providing a notch between the control-electrode zones which extends laterally partway between the first partial zone with the first main-electrode zone, on the one hand, and the second partial zone of the upper zone, on the other, and in depth from the upper side of the chip partway into the middle zone.

The notch seaprates in an advantageous manner, first of all, the lateral zones of the same conductivity type diagonally opposite one another across the notch belonging to different thyristor systems. A high du/dt-strength is attained.

A notch between two thyristors of a thyristor a.c. switch is known in another connection (DT-journal "E and M" vol. 84 (1967), no. 12, pp. 495–498); however this involves a magnetically controlled thyristor reversing switch with a different operating technique (magnetic-field control) and a notch passing through the entire chip.

Preferably the first and second main-electrode zones of the first coductivity type have a higher conductivity than the middle zone; the second partial zones of the upper and lower zones have the same second conductivity type as they but higher conductivity and extend between the second partial zone and the first main-electrode zone on the upper side of the chip as well as between the second main-electrode zone on the under side of the chip, and between the upper and lower zones to the upper and lower sides of the chip.

The second partial zones represent third and fourth main-electrode or anode zones, while the first and second main-electrode zones are emitter zones. For these contacted zones the mentioned high conductivity and high surface concentrations of charge carriers are desirable in view of the currents there.

The lateral zones of different conductivity type are separated by the upper and lower zones extending to the surface. For this purpose there is also a channel, reaching down to the upper zone, between the second control-electrode zone and the second partial zone as well as between the first control-electrode zone and the first main-electrode zone.

An additional measure taken is the obvious one of avoiding overlap (DT-AS No. 1,564,420, U.S. Pat. No. 3,123,750), i.e. the projections of the first and second main-electrode zones, on the one hand, and the projections of the second partial zones at the upper and lower sides of the chip, on the other hand, on a plane parallel to the chip plane do not overlap.

It is desirable to have small area penetrations (shortings) of the first and second main-electrode zones by extension of the first upper and the first lower partial zones to the chip surface and, in the projection on the reference plane, a first penetration of the first main-electrode zone is closer to the first control-electrode zone then is a second, while the corresponding first penetration of the second main-electrode zone is closer to the second control-electrode zone.

Arrangements like "shortings" or "shorted emitters" as penetrations of the emitter zone, or edge-contacting of the zone beneath the emitter by the emitter electrode, are known (Heumann/Stumpe, p. 35, s.v.). They help to further increase the critical voltage rise rate (du/dt). The invention makes use of this principle and in addition solves a special problem with the "shorting" configuration of the invention. The inverse thyristor with the "remote gate" has, as already mentioned, a somewhat poorer, i.e. slower triggering behavior than the normal thyristor. By the above described arrangement of the first penetration there is a shunt to the upper, emitter-side pn-junction relatively closer to the normal control-electrode zone than a corresponding shunt to the lower emitter-side pn-junction approaches the remote-gate. In this way the normal thyristor is improved in du/dt strength to a smaller degree than is the inverse thyristor and similar triggering behavior results.

With incorporation in an electronic control device with phase-shift control, operation is symmetric and even above 400W disturbing mains reactions are avoided, in particular d.c. components which could affect the functioning of fault-current circuit breakers in low-voltage systems (DIN EN 50006, July 1974).

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic, perspective representation of a semiconductor chip, part of the controllable semiconductor component, FIG. 2 is a cross-section through line II—II in FIG. 1, FIG. 3 is a cross-section through the line III—III in FIG. 1, FIG. 4 is a cross-section through the front portion of the semiconductor chip of FIG. 1, FIG. 5 is a cross section through the rear portion of the semiconductor chip of FIG. 1, FIG. 6 is a simplified, equivalent-circuit representation of the overall semiconductor component.

DETAILED DESCRIPTION OF THE PREFERRED EMBODIMENT

Figure 7:
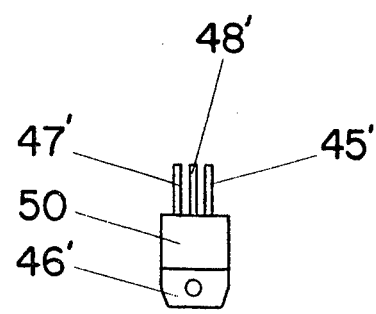
FIG. 7 is a finished semiconductor component on a 1:1 scale.

Referring now to the drawings, wherein like reference numerals designate identical or corresponding parts throughout the several views, and more particularly to FIG. 1 thereof, a semiconductor chip 10 is shown containing a normal thyristor 11 on the right side and an inverse thyristor 12 on the left.

The representation in FIG. 1, as usual, greatly distorts the actual dimensions of the semiconductor chip 10, the true extent of which in the plane of the wafer is many times the wafer thickness. Moreover, for a better view all electrodes are omitted. The sides of semiconductor chip 10 are denoted by letters A to F, where E and F are the main faces.

In detail, the semiconductor chip 10 consists of an n-type middle zone 13 stretching over the entire plane of the wafer, contacted above by an upper p-type zone 14 and below by a lower p-type zone 15. The pn-junctions are indicated by solid lines. Adjoining a first partial zone 14' of the upper zone 14 is a first n+ type main-electrode or emitter zone 16, and correspondingly on the underside of the lower zone 15, or a first partial zone 15' thereof, there is an adjoining second n+ type main-electrode or emitter zone 17. On the upper side of the upper zone 14 there is a p+ type control-electrode zone 18 at a lateral distance from the first main-electrode zone 16. The p+ −p junction 15 shown by dashed lines. A second p+ type partial zone 19 of the upper zone 14 lies diagonally opposite this first control zone 18, separated from the first main electrode zone 16 by lateral spacing and by a portion of the upper zone 14 extending to the main face E.

A second p+ type partial zone 20 of the lower zone 15 stretches over the underside of the semiconductor chip 10 from the side A to the side B and is separated from the second main electrode zone 17 by a portion of the lower zone 15 extending to the lower main face F. A second n+ type control-electrode zone 21 forms, with the upper zone 14, an additional pn-junction and thus represents a "remote gate".

Between the control-electrode zones 18 and 21 there is a notch 22 which extends from side B towards side A partway between the first partial zone 14' with the first emitter zone 16 on its one side and the second p+ type partial zone 19 of the upper zone 14 on its other side. It is open towards the main face E and reaches in the direction of the main face F into the middle zone 13.

There is both between the first control-electrode zone 18 and the first emitter zone 16, and between the second control-electrode zone 21 and the second partial zone 19, a channel 23 which extends from the main face E down to the upper zone 14 and is cut through by the notch 22.

In the region of the first emitter zone 16 are small-area penetrations 24, 25, . . . (shortings), i.e. the first upper p-type partial zone 14' extends in small-area p+ type regios up to the main face E. Analogous penetrations 30, 31, . . . by p+ type regions of the first lower p-type partial zone 15' are provided in the second emitter zone 17. A first penetration 24 of the normal thyristor 11 lies closer to the first control zone 18 than a first penetration 30 of the inverse thyristor 12 to the second control zone 21 ("remote gate") — in projection on a reference plane parallel to the wafer (cf. also distances d and c in FIGS. 2 and 3, $d < c$).

The cross-section in FIGS. 2 to 5 show the relative position of the individual penetrations 24, 25, 30, which is not visible in FIG. 1. It is apparent from FIG. 5 that the projections of the first and second main-electrode zones 16 and 17 on a reference plane parallel to the chip plane do not overlap but are separated by a distance a. These known measures (U.S. Pat. No. 3,123,750 FIG. 8) neutralize the influence of the main injection zones on the middle region of the semiconductor chip, so that the charge carrier concentration in either thyristor system caused by current output in the other is slight and — what is indeed undesired in the known case — a high du/dt — strength is achieved.

In FIG. 6 the two thyristor systems are shown separated. It is apparent that the upper and rear zones in FIG. 1, the second partial zone 19 and the emitter zone, are contacted in common by a first main electrode 41, while the lower zones, the second partial zone 20 and the second emitter zone 17, are contacted by the second main electrode 42. The connections 43 and 44 are therefore supplied by the main electrodes 41 and 42 themselves in the real contacting of the semiconductor chip 10 in FIG. 1. The actual terminals on the semiconductor chip with electrodes are the first and second main-electrode terminals 45 and 46 and the two electrically separated control-electrode terminals 47 and 48. These terminals, finally, correspond to the sequence mentioned to the external electrode leads 45', 46', 47' and 48', where the second main-electrode lead 46' usually serves simultaneously as heat sink and mechanical fastening in a printed circuit (FIG. 7).

FIG. 7 shows as an example a standard plastic case 50, DIN No. 41,869, sheet 6 (case 14A3), that together with the semiconductor chip 10 of FIG. 1 with electrodes, electrode terminals and leads forms the semiconductor component and suffices very well for applications above 400W, although there are practically two thyristors in this housing.

Figure 8:
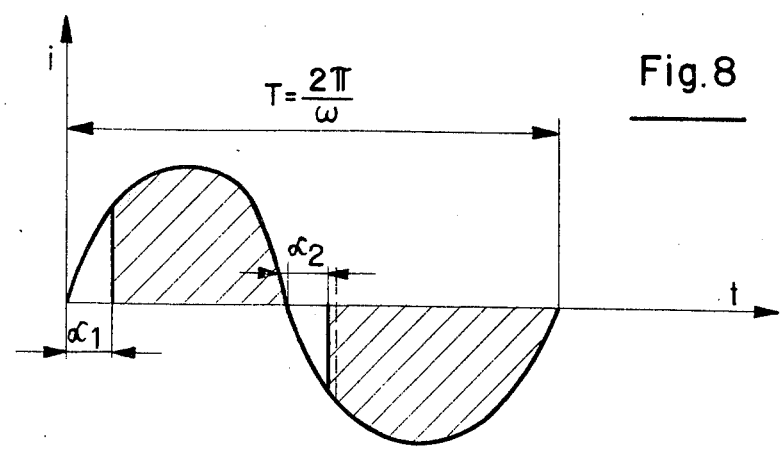
FIG. 8 is a timing diagram for switching single-phase a.c. with phase-shift control.

FIG. 8 illustrates ordinary phase-shift control. In it I = current, w = radian frequency, T = period of oscillation, $\alpha$ = control angle ($0 \leq \alpha \leq 180°$). In a known controllable semiconductor component (Triac) with normal thyristor and remote-gate thyristor, $\alpha_1 \neq \alpha_2$ (dashed line), whereas in the controllable semiconductor component of the invention with two separate conrol-electrode systems, four electrode leads in all, with neutralization of the main injection zones and with the described arrangement of "shortings" a symmetric phase-shift control ($\alpha_1 = \alpha_2$) is achieved.

The way the controllable semiconductor component works is apparent to a large degree from the preceding discussion and the known operation of the normal thyristor 11 and the inverse thyristor 12.

The normal thyristor 11 is turned on by a positive voltage between the second main-electrode terminal 46 and the first main-electrode terminal 45 and a voltage at the control-electrode terminal 47 which is positive with respect to the potential at the first main-electrode terminal 45 (FIG. 6). Thereby, the second p+ type partial zone 20 (FIG. 1) finds itself at a positive potential and acts as anode zone, whereas the first n+ type main-electrode zone is at a negative potential and acts as emitter zone. The pn-junctions between the emitter zone 16 and the first partial zone 14' and between the lower zone 15 and the middle zone 13 are forward biased, while the pn-junction between the upper zone 14 and the middle zone 13 is reverse biased at first. The inverse thyristor 12 possesses in this state an additional blocking pn-junction between the first lower p-conducting partial zone 15' and the second n+ conducting main-electrode zone 17.

The normal thyristor 11 is turned on, in that with the mentioned positive potential at the control-electrode terminal 47 and the control-electrode zone 18, a control current (hole current) flows. This induces the n+ conducting emitter zone 16 to inject electrons into the first p type partial zone 14'. Between the control-electrode zone 18 and the emitter zone 16 there thus arises a lateral voltage drop. The electrons injected into the first partial zone 14' induce hole injection from the lower zone 15 into the middle n type zone 13. These diffuse to the pn-junction between the middle zone 13 and the first partial zone 14'. Through further injection of electrons on the one hand and of holes on the other the space charge at the blocking junction is dissipated, the current through the right side of the semiconductor chip in FIG. 1 increases, until finally the entire right portion of the wafer 10 under the emitter zone 16 conducts current. By the arrangement of the notch 22 an influencing of the second upper p+ type partial zone 19 is impossible. The relatively close placement of the first penetration 24 to the control-electrode zone 18, on the contrary, implies as emitter shunt a somewhat stronger inhibition of the injection of electrons and the development of the said lateral voltage drop than is the case with the more distant placement in the inverse thyristor 12, so that, on the one hand, the triggering behavior of the two thyristors is equalized and yet, on the other hand, the greater part of the reverse current and the capacitive displacement current of the barrier layer caused by anode voltage changes can leak off by way of the appropriate penetrations 24, 25 or 30, 31. The desired high du/dt strength is thus maintained.

The inverse thyristor 12 is turned on when, with a positive voltage between the first main-electrode terminal 45 and the second main-electrode terminal 46, — i.e., the second p+ type partial zone 19 acts as anode zone and the second n+ type main-electrode zone 17 as emitter zone, — and with negative voltage at the control-electrode terminal 48 a negative control current flows, i.e. electrons are injected from the control-electrode zone 21 into the anode zone 19 and diffuse in the direction of the pn-junction between the upper zone 14 and the middle zone 13. Because of the lateral and vertical structure (notch 22, zone sequence) in the region near and under the anode zone 19 above the pn-junction between the upper zone 14 and the middle zone 13, these are transported to the latter. Thus the potential of the middle, rear n type zone 13 with respect to the p+ type partial zone 19 drops and the latter injects holes into the middle zone 13, whereas there are injected from the second main-electrode zone 17 into the first p type partial zone 15' electrons some of which eventually diffuse farther into the middle zone 13. The space change at the pn-junction between the just mentioned partial zone 15' and the middle zone 13, acting as barrier layer in this case, is dissipated, and the entire left half of the semiconductor wafer 10 below the second partial zone 19 takes over the current. The function of the remote gate 21 is known as such, with its advantages, from U.S. Pat. No. 3,275,909. In the present case, in addition, a structural separation from the other control-electrode zone 18 is effected and only electrically separate control-electrode terminals 47 and 48 and control-electrode leads 47', 48' are used.

The form of embodiment, of course, is not limited to that represented in FIG. 1. The customary beveled edges can be retained to increase the peak inverse voltage, i.e. to raise the breakdown voltage at the edge (AU-PS 244, 374). Further, a cross-shaped semiconductor wafer — in cross-section parallel to the wafer plane can be used to start with.

Obviously, numerous modifications and vibrations of the present invention are possible in light of the above teachings. It is therefore to be understood that within the scope of the appended claims, the invention may be practiced otherwise than as specifically described herein.

What is claimed as new and desired to be secured by letters patent of the U.S. is:

1. A controllable semiconductor device for two current directions comprising:

a semiconductor wafer having a middle zone of a first conductivity type extending throughout the wafer plane, an upper zone of a second conductivity type adjoining the middle zone from above, a lower zone of the second conductivity type adjoining the middle zone from below, a first main electrode zone of the first conductivity type adjoining a first partial zone of the upper zone, a second main electrode zone of the first conductivity type adjoining a first partial zone of the lower zone and laterally separated from a second partial zone of the lower zone, a first control-electrode zone of the second conductivity type on the upper side of the upper zone at a lateral distance from the first main-electrode zone and separated therefrom by a channel, a second control-electrode zone of the first conductivity type on the upper side of the upper zone at a lateral and diagonal distance from the first main-electrode zone and laterally separated by the channel from a second partial zone of the upper zone, and a notch between the control-electrode zones which extends laterally partway between the first partial zone with the first main-electrode zone, on the one hand, and the second partial zone of the upper zone, on the other hand, and in its depth going from the upper towards the lower side of the semiconductor wafer partway into the middle zone;

a first main electrode contacting the first main-electrode zone and the second partial zone of the upper zone;

a second main electrode contacting the second main-electrode zone and the second partial zone of the lower zone;

a control-electrode arrangement for separate contacting of the two control electrode zones; and a case enclosing the wafer, wherein the two control-electrode leads are brought out electrically separated through the case from their separate control electrodes on the semiconductor wafer.

2. The controllable semiconductor device recited in claim 1, wherein the first and the second main-electrode zones of the first conductivity type possess a higher conductivity than the middle zone; the second partial zones of the upper and the lower one exhibit the same second conductivity type as the upper and the lower zone but a higher conductivity than the upper and the lower zone; and the second partial zone and the first main-electrode zone on the upper side of the semi-conductor wafer as well as the second partial zone and the second main-electrode zone on the underside of the semiconductor wafer, the upper and lower zones respectively, are separated by parts of the upper and lower zone, respectively, extending in these areas to the upper and lower surfaces, respectively, of the semiconductor wafer.

3. The controllable semiconductor device recited in claim 1, wherein the channel between the second control-electrode zone and the second partial zone as well as between the first control-electrode zone and the first main-electrode reaches in depth down to the upper zone.

4. The controllable semiconductor device recited in claim 1, wherein the projections of the first and second main-electrode zones, and the projections of the second partial zones at the upper and lower sides of the semiconductor chip onto a reference plane parallel to the wafer plane do not overlap.

5. The controllable semiconductor device recited in claim 1, wherein small-area penetrations of the first and second main-electrode zones respectively, are provided by extension of the first upper and first lower partial zones, respectively, to the respective main faces of the semiconductor wafer and that, in projection on the reference plane, a first penetration of the first main-electrode zone lies nearer to the first control-electrode zone than a corresponding penetration of the second main-electrode zone does to the second control-electrode zone.

* * * * *